(12) United States Patent
Yoon et al.

(10) Patent No.: US 7,388,158 B2
(45) Date of Patent: Jun. 17, 2008

(54) CONCENTRIC SPACER FOR REDUCING CAPACITIVE COUPLING IN MULTILAYER SUBSTRATE ASSEMBLIES

(75) Inventors: Yeong Joo Yoon, Thousand Oaks, CA (US); Fernando Aguirre, Los Angeles, CA (US); Nicholas Teneketges, Thousand Oaks, CA (US)

(73) Assignee: Terdyne, Inc., North Reading, MA (US)

( * ) Notice: Subject to any disclaimer, the term of this patent is extended or adjusted under 35 U.S.C. 154(b) by 183 days.

(21) Appl. No.: 10/817,785

(22) Filed: Sep. 17, 2004

(65) Prior Publication Data

US 2006/0060376 A1    Mar. 23, 2006

(51) Int. Cl.
*H01R 12/04* (2006.01)
*H05K 1/11* (2006.01)
*H05K 3/00* (2006.01)
*H05K 3/30* (2006.01)

(52) U.S. Cl. .................... 174/262; 174/250; 174/261; 29/830; 29/832

(58) Field of Classification Search .......... 174/260, 174/262–266; 361/792–795; 29/830, 832, 29/837
See application file for complete search history.

(56) References Cited

U.S. PATENT DOCUMENTS

| | | | | |
|---|---|---|---|---|
| 5,093,761 | A * | 3/1992 | Ozaki | 361/792 |
| 6,013,588 | A * | 1/2000 | Ozaki | 442/179 |
| 6,137,062 | A * | 10/2000 | Zimmerman | 174/260 |
| 6,233,820 | B1 * | 5/2001 | Hummelink | 29/847 |
| 6,392,164 | B1 | 5/2002 | Iwaki et al. | |
| 6,456,502 | B1 * | 9/2002 | Miller et al. | 361/760 |
| 6,834,426 | B1 * | 12/2004 | Japp et al. | 29/830 |
| 2001/0054939 | A1 | 12/2001 | Zhu et al. | |
| 2002/0179332 | A1 * | 12/2002 | Uematsu et al. | 174/262 |
| 2003/0201123 | A1 | 10/2003 | Kistner | |
| 2004/0238216 | A1 * | 12/2004 | Jessep et al. | 174/262 |
| 2005/0011675 | A1 * | 1/2005 | Barr et al. | 174/262 |
| 2005/0011676 | A1 * | 1/2005 | Barr et al. | 174/262 |

\* cited by examiner

*Primary Examiner*—Jeremy C Norris
(74) *Attorney, Agent, or Firm*—Christopher R. Balzan, Esq.

(57) ABSTRACT

In one embodiment, a substrate assembly includes a flat substrate having oppositely disposed planar surfaces and a conductor. The conductor is formed on at least one of the planar surfaces and defines a conductor plane. The structure further includes an oversized-in-diameter anti-pad formed through the substrate layer and the conductor layer. The anti-pad further includes a dielectric spacer formed substantially coplanar with the conductor plane.

10 Claims, 4 Drawing Sheets

CONCENTRIC SPACER FOR REDUCING CAPACITIVE COUPLING IN MULTILAYER SUBSTRATE ASSEMBLIES

FIELD

The multi-layered substrate assembly disclosed herein relates generally to circuit board and packaging substrate technology, and more specifically to substrate configurations that minimize capacitive coupling on signal paths.

BACKGROUND

Modern printed circuit board technology typically employs a multi-layered approach to efficiently distribute large groups of signal paths. For example, and referring to FIG. 1, an electronic assembly 10 often includes a flip-chip bonded semiconductor device 12 mounted within a ball grid array (BGA) package 14 that in-turn, interfaces with a PCB assembly 16. While different in size and scale, both the package and the PCB assembly employ multi-layer circuit board technology.

Multi-layer circuit boards, whether large PCBs or small micro-boards, typically utilize a plurality of stacked layers 20 for efficient signal routing. The layers 20, as shown in FIG. 2A, each generally include a flat dielectric substrate 22 and a thin conductor 24. The conductor provides a ground/power plane, and is often deposited on the substrate. The layers are laminated in a stacked arrangement with relative precision to preserve strict planarity specifications. Vias 26 formed transverse to the substrate and conductor portion enable layer-to-layer signal routing. The vias are electrically isolated from the conductive plane by a dielectric-filled and metallization-free area known generally as an anti-pad 28.

Typically, the entire structure is fabricated according to design rules appropriate for the specific process. Deviating from the standard design rules for a given process often results in additional cost, and/or unexpected problems. One design rule governing the formation of anti-pads constrains the diameter of the anti-pad in an effort to minimize sagging, or non-planarity in the area of the anti-pad (illustrated in phantom in FIG. 2B). We have found that enlarging the anti-pads enhances performance for high speed signals. Unfortunately, to do this conventionally by customizing the design outside of the conventional design rules often adds undue cost.

What is needed and as yet unavailable is a circuit board structure that allows for the expansion of anti-pads without violating standard fabrication design rules. The circuit board structure described herein satisfies this need.

SUMMARY

The substrate assembly described herein provides a unique way to enlarge anti-pad structures with minimal effects on overall board planarity. This allows for a significant reduction in capacitive coupling between vertical signal paths and power/ground planes. As a result, optimal signal performance and fidelity is available for high-bandwidth applications.

To realize the foregoing advantages, a substrate assembly is disclosed. The assembly includes a flat substrate having oppositely disposed planar surfaces and a conductor. The conductor is formed on at least one of the planar surfaces and defines a conductor plane. The structure further includes an oversized-in-diameter anti-pad formed through the substrate layer and the conductor layer. The anti-pad further includes a spacer formed substantially coplanar with the conductor plane.

In another form, the substrate assembly is employed in a multi-layered circuit board assembly for routing a plurality of signal paths. The multi-layered circuit board assembly comprises a plurality of layers, with each layer comprising a flat substrate having oppositely disposed planar surfaces and a conductor formed on at least one of the planar surfaces. The conductor defines a conductor plane. An oversized-in-diameter anti-pad is formed through the substrate and the conductor, and includes a conductive via oriented transverse to the substrate and the conductor layer. The anti-pad further includes a spacer disposed substantially coplanar with the conductor plane.

In yet another form, the substrate assembly is employed in a ball-grid-array package for housing at least one semiconductor device. The package has a contact interface adapted for interfacing to a circuit board, the contact interface comprising an array of solder ball pads disposed across an interface layer. The package further comprises a circuit board assembly coupled to the contact interface, the circuit board assembly including a flat substrate having oppositely disposed planar surfaces and a conductor formed on at least one of the planar surfaces. The conductor defines a conductor plane. An oversized-in-diameter anti-pad is formed through the substrate and the conductor and includes a spacer disposed substantially coplanar with the conductor plane.

In yet another form, a method of manufacturing a substrate assembly is described herein. The method comprises the steps forming a flat substrate core having oppositely disposed planar surfaces; depositing a conductor on the substrate to form a conductor plane and masking portions of the conductor plane corresponding to electrically isolated spacers coplanar with the conductor plane; etching the masked portions of the conductor layer to define the spacers; depositing additional dielectric over the etched conductor layer; establishing an opening through the substrate transverse to the planar surfaces; and filling the opening with a dielectric to form an anti-pad having an outer diameter.

Other features and advantages of the present invention will be apparent from the following detailed description when read in conjunction with the accompanying drawings.

BRIEF DESCRIPTION OF THE DRAWINGS

The circuit board structure described herein will be better understood by reference to the following more detailed description and accompanying drawings in which.

DETAILED DESCRIPTION

The multi-layered substrate assembly described herein provides a high performance solution for minimizing capacitive coupling acting on a signal path due to undesirably small anti-pad diameters. This is accomplished by employing a spacer in the anti-pad such that an expanded diameter may be realized with minimal deviations to overall planarity due to sag.

Figure 3:
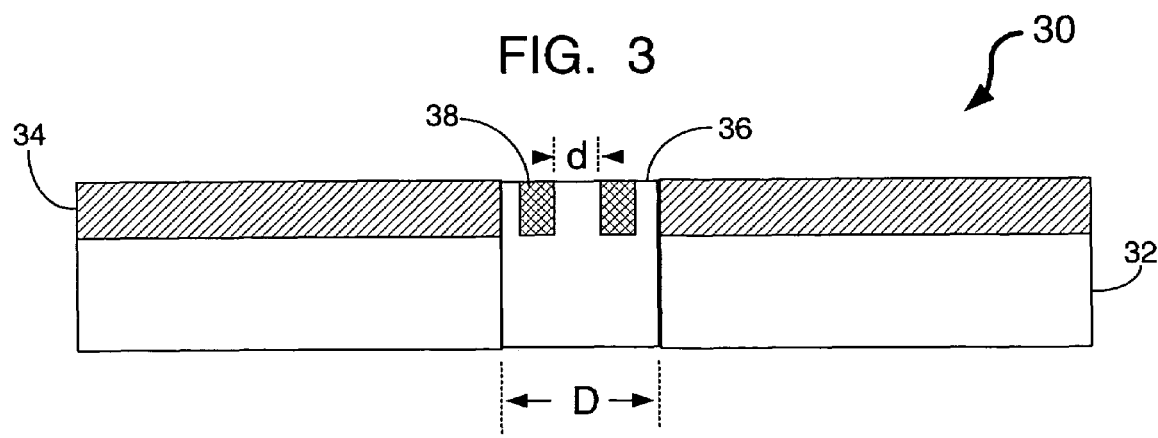
FIG. 3 is a partial transverse view of an improved circuit board structure.

Referring now to FIG. 3, an improved multi-layer substrate assembly, generally designated 30, comprises a substrate core layer 32 and a conductor layer 34 deposited on the substrate. The substrate core preferably takes the form of a dielectric material, such as FR-4, BT, polyimide, or other acceptable substrate core material, for example. Copper foil provides an acceptable conductor layer. A cylindrical area free of metallization and filled with a dielectric is formed transverse to the substrate layer and conductor layer to define an anti-pad 36. The anti-pad diameter is oversized with respect to predefined process design rules.

For the general structure described above, design rules would typically constrain the size of the anti-pad. We have discovered several applications where an enlarged anti-pad provides enhanced signal propagation performance. We have also discovered a way to minimize sag while expanding the effective diameter of the anti-pad to enable our high-performance objectives.

To do this, and further referring to FIG. 3, the anti-pad 36 is supplemented with an electrically isolated spacer 38. The spacer preferably takes the form of a ring, or a plurality of concentric rings (not shown) disposed at one axial end of the anti-pad, substantially coplanar with the conductor layer 34, and fabricated out of a similar electrically conductive material as that of the conductor layer. A dielectric fills in any gaps associated with the spacer and its positioning with respect to the conductive layer such that a flat planar surface is maintained.

Figure 4:
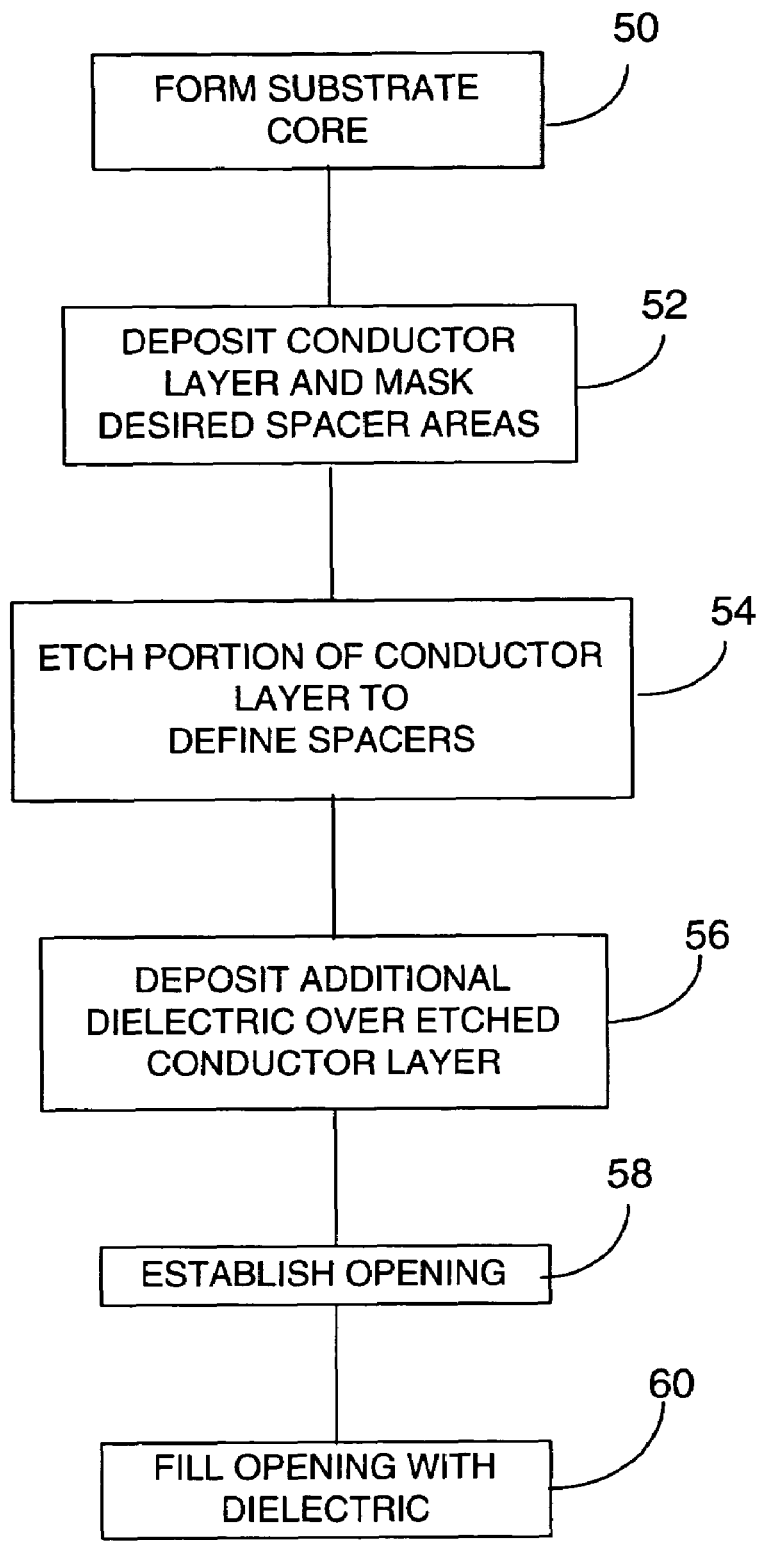
FIG. 4 is a flow chart illustrating a method of manufacturing the circuit board structure of FIG. 3.

Manufacturing the structure is a straightforward process that differs little from conventional practices. Generally, as shown in FIG. 4, a suitable substrate core is first formed, at step 50. A metallization or conductive layer is then deposited, at step 52. The deposition process also includes patterning certain portions of the conductor layer corresponding to the locations of desired spacer structures. At step 54, the conductor layer is etched, and the spacers formed consistent with the previous masking step. Dielectric is then applied over the etched conductor layer, at step 56. An opening is then established through the substrate, at step 58, by a mechanical drilling process to define the anti-pad opening. The opening is then filled with dielectric, at step 60. Further steps within the basic method described above may be performed, such as via formation, depending on the application. The process may be repeated several times, depending on the number of layers desired.

In operation, the spacers 38 provide rigid structures to supplement the dielectric and prevent sagging of the oversized-in-diameter anti-pad 36. However, since the spacer comprises a conductive material matching that of the conductor layer, the design rule diameter is satisfied by the diameter dimension "d" (FIG. 3), while the effective diameter for high-performance purposes, defined by the dimension "D", is maximized.

Figure 5:
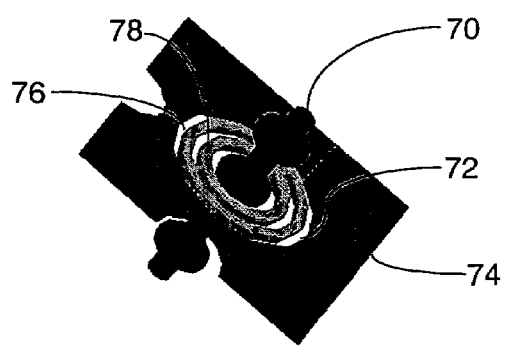
FIG. 5 is a partial perspective view of a circuit board structure of FIG. 3 applied to a printed circuit board having signal vias.

One specific application that benefits from the spacer structures described above relates to multiple layers in chip/multi-chip modules (MCM), or printed circuit boards (PCBs). FIG. 5 illustrates the application, where a conductive via 70 is formed through the anti-pad defined by the opening at 72, and electrically isolated from both the conductor layer 74 and a plurality of concentric spacers 76 and 78. Under conventional design rules, the ratio of the anti-pad diameter to the via diameter is typically less than three (3). As explained above, one of the primary purposes of this constraint is to minimize sagging (from an enlarged anti-pad) which would lead to layer-to-layer planarity problems. However, while the close proximity of the via 70 to the anti-pad 72 helps reduce sagging, it also contributes to parasitic capacitive coupling, which degrades signal performance.

We have discovered that by enlarging the anti-pad diameter, and employing the spacer structure described above, parasitic capacitance acting on the signal via 70 coupled from the conductor layer 74 (power or ground plane) is greatly reduced. Moreover, by making the ratio of the anti-pad diameter versus via diameter within the range-of five (5) to eight (8), the impedance of the via structure approaches fifty (50) ohms, which is highly desirable.

Figure 6:
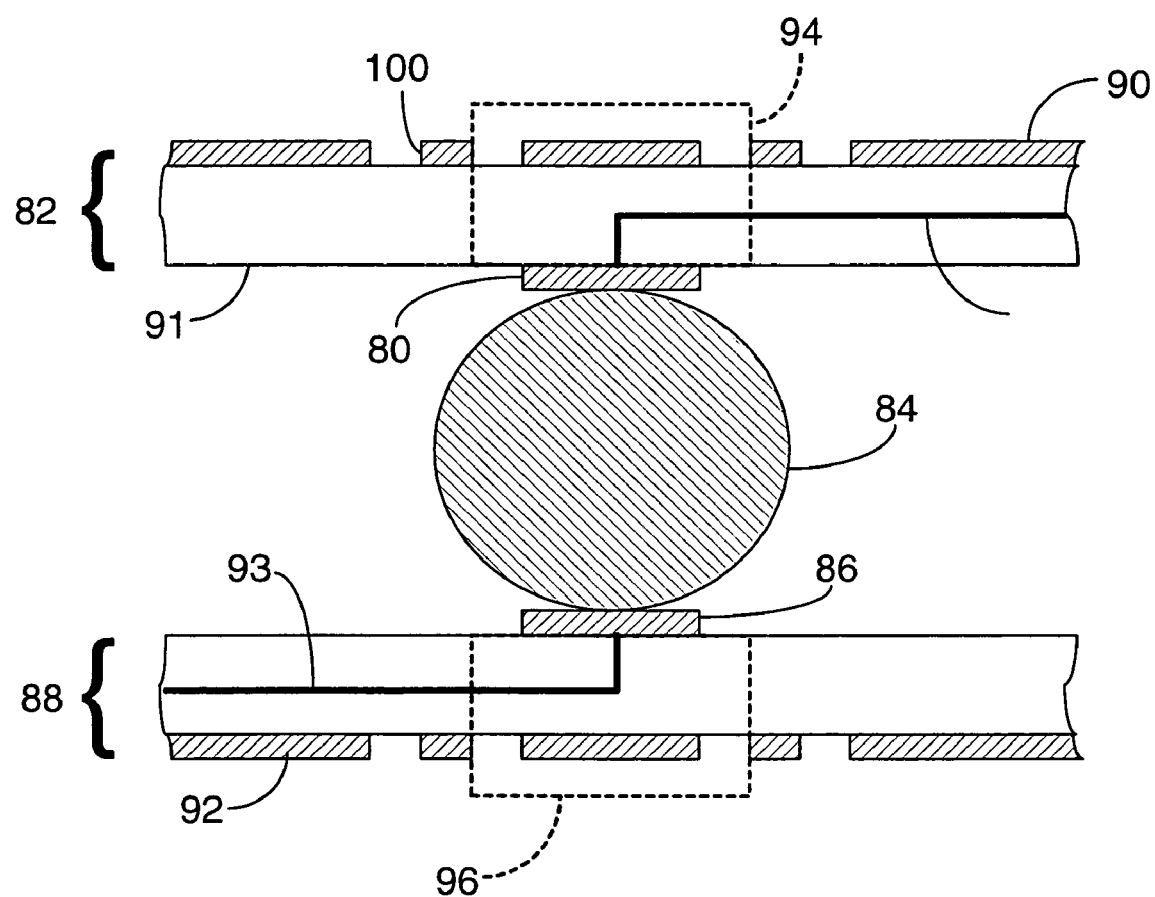
FIG. 6 is a partial transverse view of a circuit board structure of FIG. 3 applied to a BGA package scheme with solder ball pads.

FIG. 6 illustrates an additional application for the unique spacer structures described above involving ball-grid-array (BGA) interface connections. BGA and microBGA packages allow for efficient electrical connections between packaged semiconductor devices and PCBs. The package often includes a substrate assembly 82 having a substrate core 91 and a power/ground plane 90. A signal via 89 routed through the substrate core couples to a solder ball pad 80 formed on the package exterior. A solder ball 84 electrically connects the solder ball pad to a correspondingly aligned pad on an interface layer 88 of a printed circuit board assembly. The interface layer has a similar structure to that of the BGA package substrate assembly.

One of the problems faced by the conventional BGA interface scheme involves a parasitic parallel plate capacitance between the solder ball pad 80 and the adjacent power/ground plane 82. The problem may manifest itself both at the BGA-packaged circuit board and the PCB assembly 88.

We have discovered that by employing electrically isolated concentric spacers adjacent the solder ball pads in an anti-pad zone 94 (in phantom), the parallel plate capacitance between the solder ball pads 80, 86 and the respective power/ground planes 90 and 92 for both the BGA package and the PCB are minimized. This is done by forming anti-pads proximate the solder ball pad locations at 94 and 96, thereby removing one side of the parallel plate capacitor. To minimize any sagging in the anti-pad, concentric spacers 100 and 102 similar to those described in the previous examples are employed. As a result, signals propagating through the BGA package to the PCB retain high fidelity.

Figure 1:
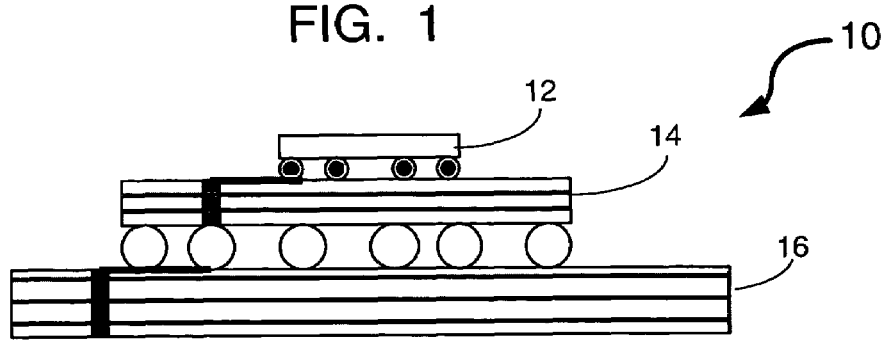
FIG. 1 is a high level diagram, not to scale, of a ball-grid-array package mounted to a printed circuit board assembly.
Figure 2A:
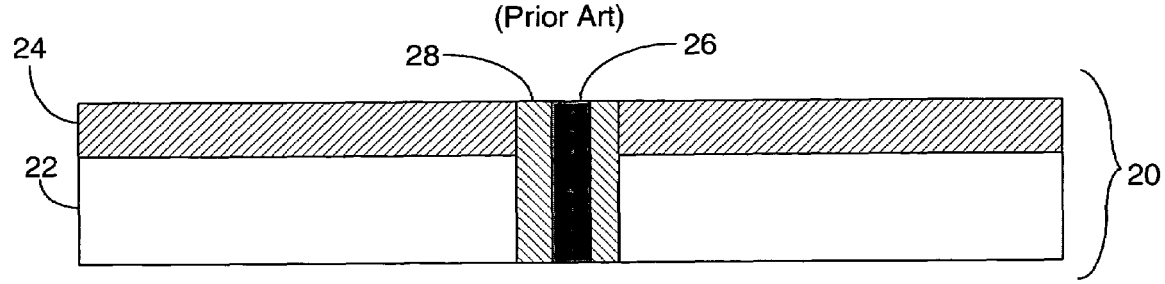
FIG. 2A is a partial transverse view of a conventional circuit board layer.
Figure 2B:
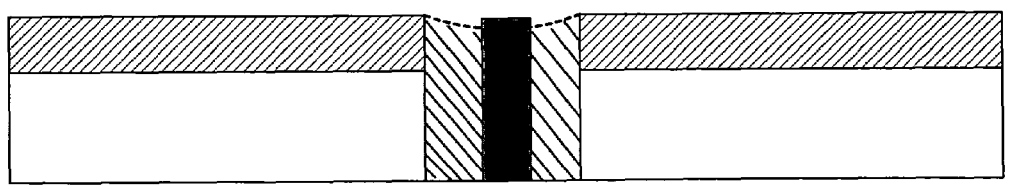
FIG. 2B is a view similar to FIG. 2A, and illustrates the non-planar sagging associated with conventional anti-pads having overly expanded diameters.

At a higher level, the spacer structures disclosed herein optimally enhance signal fidelity at several levels of routing. An electronic assembly comprising an MCM/BGA package interface (such as that in FIG. 5) mounted to a printed circuit board (such as that in FIG. 4) achieves optimal performance by consistently employing the anti-pad spacer configuration throughout the assembly. The overall assembly is shown generally by the illustration in FIG. 1.

Those skilled in the art will recognize the many benefits and advantages afforded by the multi-layered substrate assembly described herein. Of significant importance is the use of enlarged anti-pads having unique spacer structures to minimize parasitic capacitance acting on signals propagating through the circuit board structure. The spacers help to maintain planarity where the oversized antipads are employed.

While the invention has been particularly shown and described with reference to the preferred embodiments thereof, it will be understood by those skilled in the art that various changes in form and detail may be made therein without departing from the spirit and scope of the invention. For instance, while specific applications concerning printed circuit boards and BGA packaging schemes have been described in detail, the spacer structures described herein may be advantageously applied to any form of multi-layered substrate assembly, whether at the macro or micro level.

Further, while preferred spacer configurations have been described herein, a wide variety of shapes and materials may be employed to provide the benefits and advantages discussed above. For example, spacers taking the form of non-circular shapes, non-continuous shapes, and the like may be used with acceptable results. Additionally, the spacers may be formed of a rigid dielectric rather than a conductive material.

What is claimed is:

1. A substrate assembly, the assembly comprising:
a flat substrate having oppositely disposed planar surfaces;
a conductor formed on at least one of the planar surfaces, the conductor layer defining a conductor plane;
an oversized-in-diameter anti-pad formed through the substrate and the conductor, the anti-pad further formed with a spacer disposed substantially coplanar with the conductor plane;
the spacer comprising a dielectric; and
wherein the spacer is isolated from the conductor.

2. A substrate assembly, the assembly comprising:
a flat substrate having oppositely disposed planar surfaces;
a conductor formed on at least one of the planar surfaces, the conductor layer defining a conductor plane;
an oversized-in-diameter anti-pad formed through the substrate and the conductor, the anti-pad further formed with a spacer disposed substantially coplanar with the conductor plane;
a conductive via formed in the anti-pad, the via oriented transverse to the substrate and the conductor;
the spacer comprising a dielectric;
wherein the spacer is coaxially interposed between the via and the conductor and
wherein the spacer is spaced away from the via and the conductor.

3. A substrate assembly, the assembly comprising:
a flat substrate having oppositely disposed planar surfaces;
a conductor formed on at least one of the planar surfaces, the conductor layer defining a conductor plane;
an oversized-in-diameter anti-pad formed through the substrate and the conductor, the anti-pad further formed with a spacer disposed substantially coplanar with the conductor plane;
the spacer comprising a dielectric; and
wherein the spacer comprises a plurality of concentric spaced-apart rings.

4. A multi-layered circuit board assembly for routing a plurality of signal paths, the multi-layered circuit board assembly comprising a plurality of layers, each layer comprising:
a flat substrate having oppositely disposed planar surfaces;
a conductor formed on at least one of the planar surfaces, the conductor layer defining a conductor plane;
an oversized-in-diameter anti-pad formed through the substrate and the conductor, the anti-pad further including a conductor via oriented transverse to the substrate and the conductor;
a spacer formed in the anti-pad, the spacer disposed substantially coplanar with the conductor plane;
the spacer comprising a dielectric; and
wherein the spacer is spaced away from the conductor.

5. A multi-layered circuit board assembly for routing a plurality of signal paths, the multi-layered circuit board assembly comprising a plurality of layers, each layer comprising:
a flat substrate having oppositely disposed planar surfaces;
a conductor formed on at least one of the planar surfaces, the conductor layer defining a conductor plane;
an oversized-in-diameter anti-pad formed through the substrate and the conductor, the anti-pad further including a conductor via oriented transverse to the substrate and the conductor;
a spacer formed in the anti-pad, the spacer disposed substantially coplanar with the conductor plane;
the spacer comprising a dielectric; and
wherein the spacer is spaced away from the via and the conductor.

6. A multi-layered circuit board assembly for routing a plurality of signal paths, the multi-layered circuit board assembly comprising a plurality of layers, each layer comprising:
a flat substrate having oppositely disposed planar surfaces;
a conductor formed on at least one of the planar surfaces, the conductor layer defining a conductor plane;
an oversized-in-diameter anti-pad formed through the substrate and the conductor, the anti-pad further including a conductor via oriented transverse to the substrate and the conductor;
a spacer formed in the anti-pad, the spacer disposed substantially coplanar with the conductor plane; and
the spacer comprising a dielectric; and
wherein the spacer comprises a plurality of concentric spaced-apart rings.

7. A ball-grid-array package for housing at least one semiconductor device, the package have a contact interface adapted for interfacing to a multi-layered circuit board assembly, the contact interface comprising an array of solder ball pads disposed across an interface layer, the package further comprising a substrate assembly coupled to the contact interface, the substrate assembly comprising:
a flat substrate having oppositely disposed planar surfaces;
a conductor formed on at least one of the planar surfaces, the conductor layer defining a conductor plane;
an oversized-in-diameter anti-pad formed through the substrate and the conductor;
a spacer formed in the anti-pad, the spacer disposed substantially coplanar with the conductor;
the spacer comprising a dielectric; and
wherein the spacer is spaced away from the conductor.

8. A ball-grid-array package for housing at least one semiconductor device, the package have a contact interface adapted for interfacing to a multi-layered circuit board assembly, the contact interface comprising an array of solder ball pads disposed across an interface layer, the package further comprising a substrate assembly coupled to the contact interface, the substrate assembly comprising:
a flat substrate having oppositely disposed planar surfaces;
a conductor formed on at least one of the planar surfaces, the conductor layer defining a conductor plane;
an oversized-in-diameter anti-pad formed through the substrate and the conductor;
a spacer formed in the anti-pad, the spacer disposed substantially coplanar with the conductor;
the spacer comprising a dielectric; and
wherein the spacer comprises: a plurality of concentric spaced-apart rings.

9. A method of manufacturing a substrate assembly, the method comprising the steps:

forming a flat substrate core having oppositely disposed planar surfaces;

depositing a conductor on the substrate to form a conductor plane and masking portions of the conductor plane corresponding to electrically isolated spacers coplanar with the conductor plane;

etching the masked portions of the conductor layer to define the spacers;

depositing additional dielectric over the etched conductor layer;

establishing an opening through the substrate transverse to the planar surfaces after depositing the additional dielectric over the etched conductor; and filling the opening with a dielectric to form an anti-pad having an outer diameter.

10. The method of claim 9 further comprising forming a via after filling the opening.

* * * * *